United States Patent
Kang et al.

(10) Patent No.: US 8,004,176 B2
(45) Date of Patent: Aug. 23, 2011

(54) ORGANIC LIGHT EMITTING DISPLAY HAVING REDUCED MANUFACTURING SHORTS AND METHOD OF FABRICATING THE SAME

(75) Inventors: Tae-Wook Kang, Suwon-si (KR); Mu-Hyun Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 962 days.

(21) Appl. No.: 11/247,991

(22) Filed: Oct. 11, 2005

(65) Prior Publication Data

US 2006/0082292 A1    Apr. 20, 2006

(30) Foreign Application Priority Data

Oct. 11, 2004  (KR) .................. 10-2004-0081103

(51) Int. Cl.
*H01J 1/62* (2006.01)
(52) U.S. Cl. ................................ 313/504
(58) Field of Classification Search .......... 313/503, 313/504, 506, 509
See application file for complete search history.

(56) References Cited

U.S. PATENT DOCUMENTS

| | | | |
|---|---|---|---|
| 5,905,548 A | 5/1999 | Shimada | |
| 6,326,726 B1 * | 12/2001 | Mizutani et al. | 313/504 |
| 6,727,645 B2 * | 4/2004 | Tsujimura et al. | 313/504 |
| 6,798,132 B2 * | 9/2004 | Satake | 313/495 |
| 2002/0190924 A1 * | 12/2002 | Asano et al. | 345/55 |
| 2003/0098645 A1 * | 5/2003 | Lee et al. | 313/504 |
| 2003/0098646 A1 * | 5/2003 | Suh et al. | 313/504 |
| 2003/0146693 A1 | 8/2003 | Ishihara et al. | |
| 2003/0193285 A1 * | 10/2003 | Kim | 313/504 |
| 2004/0169460 A1 | 9/2004 | Chang et al. | |
| 2006/0152136 A1 * | 7/2006 | Fujikake et al. | 313/503 |
| 2007/0194677 A1 * | 8/2007 | Liu et al. | 313/112 |

FOREIGN PATENT DOCUMENTS

| | | |
|---|---|---|
| CN | 1481199 | 3/2004 |
| JP | 2002-202737 | 7/2002 |
| JP | 2002-215063 | 7/2002 |
| JP | 2003-168569 | 6/2003 |
| JP | 2004-063085 | 2/2004 |

OTHER PUBLICATIONS

Japanese Patent Office Action issued in Japanese Patent Application No. 2005-296684, dated Dec. 2, 2008.
Chinese Patent Registration Gazette issued Oct. 15, 2008 for corresponding Chinese Patent Application No. 200510129188.0.

* cited by examiner

*Primary Examiner* — Toan Ton
*Assistant Examiner* — Britt D Hanley
(74) *Attorney, Agent, or Firm* — Knobbe Martens Olson & Bear LLP

(57) ABSTRACT

In one embodiment, an organic light emitting display (OLED) includes a thin film transistor (TFT) disposed on a substrate. In addition, the display includes: an insulating layer disposed on the TFT and having a via hole; a pixel electrode disposed on the insulating layer and connected to a drain electrode of the TFT through the via hole; an emission layer disposed on the pixel electrode; and an opposite electrode pattern disposed on the emission layer and exposing at least an upper region of the via hole. This avoids close configuration proximity between the opposite electrode and the pixel layer thus reducing the possibility of a short circuit.

10 Claims, 6 Drawing Sheets

ORGANIC LIGHT EMITTING DISPLAY HAVING REDUCED MANUFACTURING SHORTS AND METHOD OF FABRICATING THE SAME

CROSS-REFERENCE TO RELATED APPLICATION

This application claims priority to and the benefit of Korean Patent Application No. 2004-81103, filed on Oct. 11, 2004, which is incorporated herein by reference in its entirety.

BACKGROUND OF THE INVENTION

1. Field of the Invention

The present invention relates to an organic light emitting display (OLED) and method of fabricating the same, and, more particularly, to an OLED and method of fabricating the same, which can substantially prevent a short circuit between a pixel electrode and an opposite electrode.

2. Description of the Related Technology

An organic light emitting display (OLED) is quite appropriate for use to display moving images irrespective of its size because the OLED has a fast response speed of 1 ms or less, consumes low power, and is an emissive display element and therefore has a wide viewing angle. Also, the OLED can be fabricated at low temperature and in a simple process based on conventional semiconductor manufacturing technology. For these reasons, the OLED has attracted much attention as the next-generation flat panel display (FPD) element.

FIG. 1 is a cross-sectional view of a unit pixel of a conventional OLED.

Referring to FIG. 1, a pixel electrode 150 of the OLED is connected to a drain electrode 130b of a thin film transistor "E" through a via hole 145 formed in a planarization layer 140. An organic layer 160 including an emission layer and a pixel defining layer 155 are disposed on the pixel electrode 150, and an opposite electrode 165 is disposed on the resultant structure.

In the above-described structure, it can be seen that the pixel defining layer 155 formed in a portion "A" of the via hole 145 is thin in the vicinity of an etched portion $t_1$ of the planarization layer 140.

FIG. 2 is a photograph of the portion "A" of the via hole 145 of FIG. 1.

Referring to FIG. 2, the thickness t1 of the pixel defining layer 155 in an end portion "B" of the planarization layer 140 is formed thinner than the thickness t2 of the pixel defining layer 155 formed in the via hole 145. As a result, when the opposite electrode 165 is formed on the pixel defining layer 155, a short circuit between the opposite electrode 165 and the pixel electrode 150 may arise. The short circuit may lead to a failure in a unit pixel, causing dark spots when the OLED is driven.

SUMMARY OF CERTAIN INVENTIVE EMBODIMENTS

The present invention, therefore, provides an organic light emitting display (OLED) and method of fabricating the same, which can reduce electrical shorting between a pixel electrode and an opposite electrode to prevent generation of dark spots in a display region.

BRIEF DESCRIPTION OF THE DRAWINGS

The above and other features and advantages of certain inventive aspects are discussed with further detailed exemplary embodiments with reference to the attached drawings in which.

DETAILED DESCRIPTION OF CERTAIN INVENTIVE EMBODIMENTS

Figure 1:
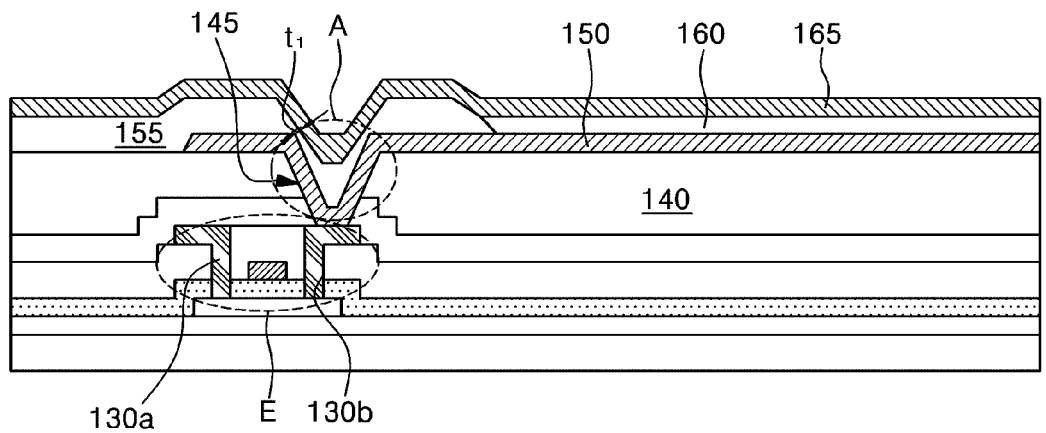
FIG. 1 is a cross-sectional view of a unit pixel of a conventional organic light emitting display (OLED)
Figure 2:
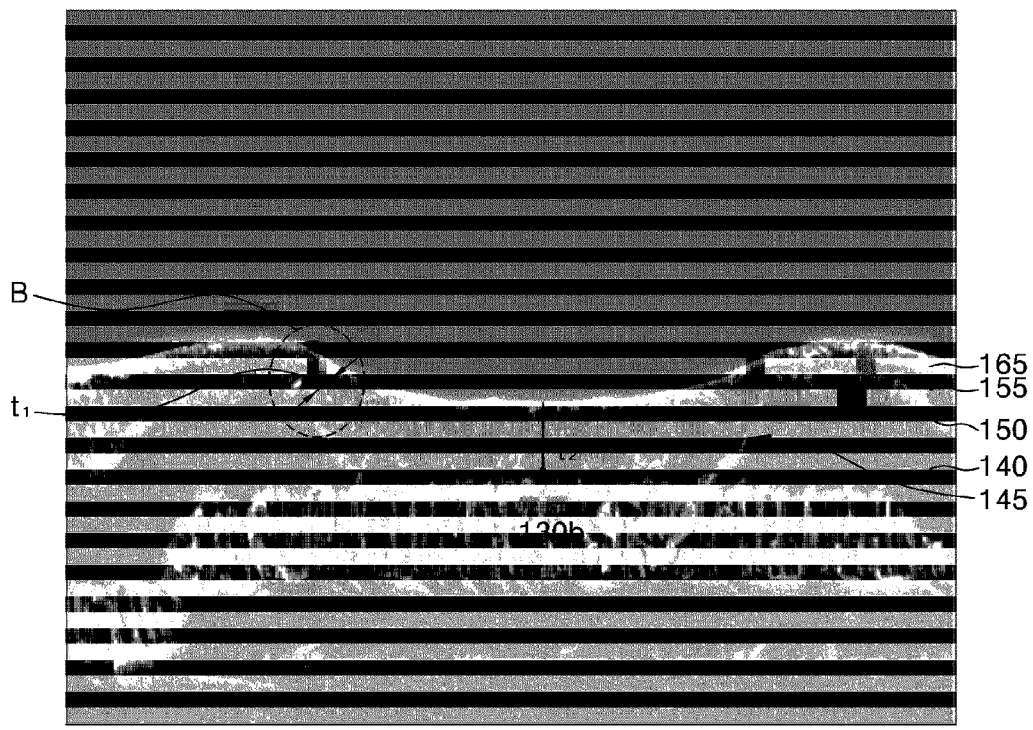
FIG. 2 is a photograph of the portion "A" of FIG. 1.

The present invention will now be described more fully hereinafter with reference to the accompanying drawings, in which exemplary embodiments are shown. Embodiments may take various forms and should not be construed as limited to the specific embodiments set forth herein. The thicknesses of layers or regions shown in the drawings are exaggerated for clarity. The same reference numerals are used to denote the same elements throughout the specification.

Figure 3A:
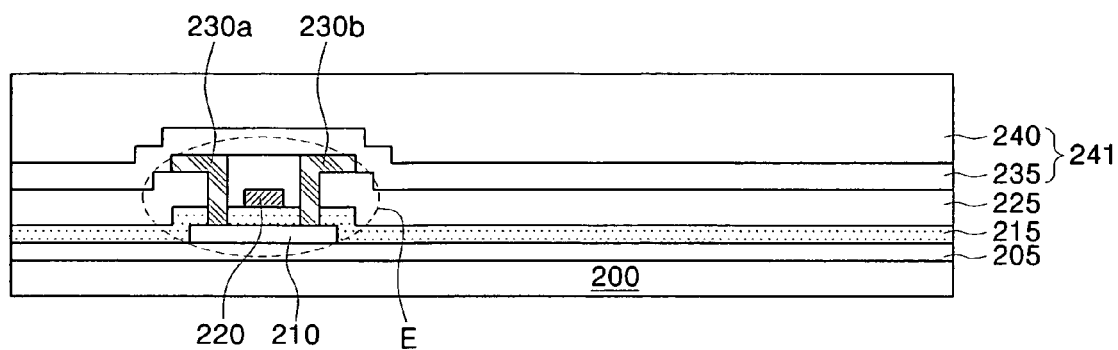
FIGS. 3A to 3C are cross-sectional views illustrating a method of fabricating an OLED according to a first exemplary embodiment.
Figure 3B:
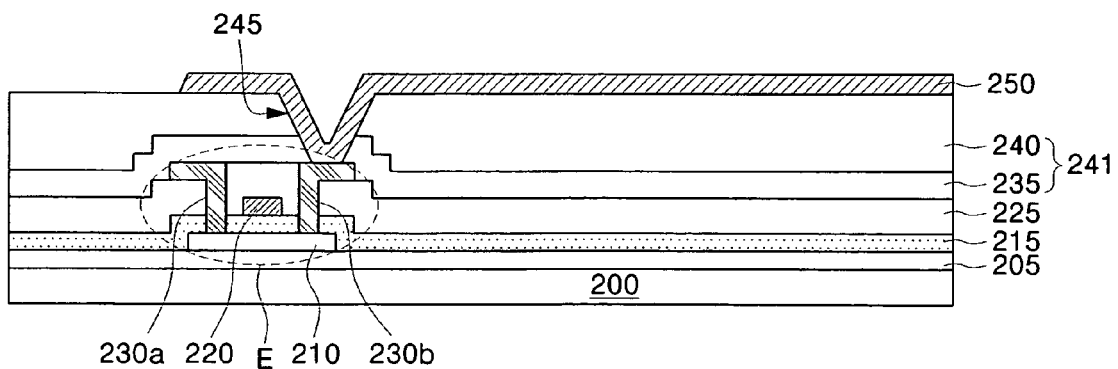
Figure 3C:
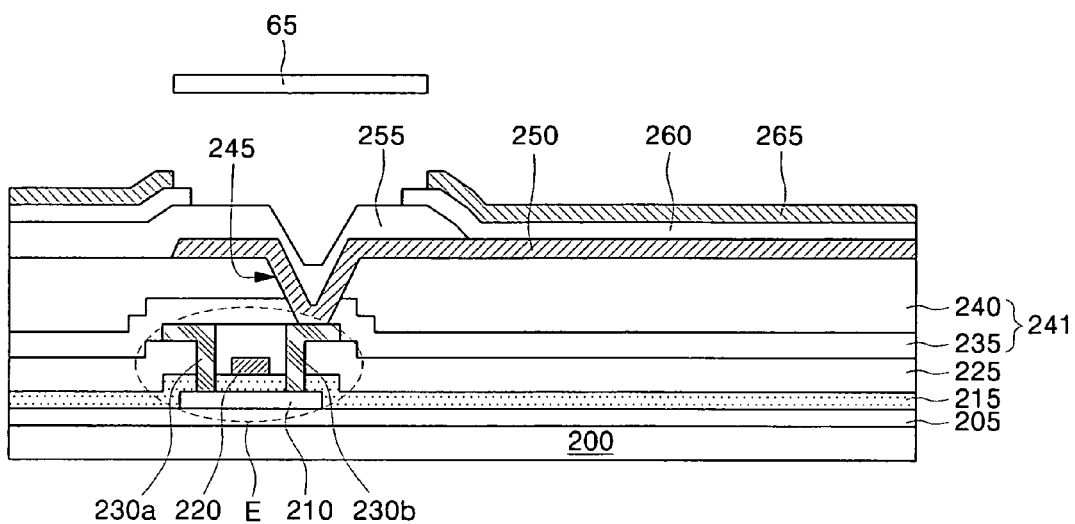

FIG. 3C is a cross-sectional view of a unit pixel of an organic light emitting display (OLED) according to a first exemplary embodiment. Referring to FIG. 3C, a thin film transistor (TFT) "E" including a semiconductor layer 210, a gate electrode 220, a source electrode 230a, and a drain electrode 230b is disposed on a substrate 200. An insulating layer (not shown) is disposed on the TFT "E." The insulating layer may comprise one or more inorganic layers, and/or one or more organic layers.

For example, a planarization layer 240, which may be an organic layer, is disposed over the TFT "E," and an inorganic passivation layer 235 may be interposed between the TFT "E" and the planarization layer 240. The inorganic passivation layer 235 may be formed to passivate the semiconductor layer 210 and protect the above-described layers.

A pixel electrode 250 is disposed on the planarization layer 240, and is connected to the drain electrode 230b of the TFT "E" through a via hole 245 formed in the planarization layer 240.

A pixel defining layer 255 is disposed on the pixel electrode 250 such that it covers the via hole 245. Thus, the pixel defining layer 255 serves to define the boundary of an emission region of a unit pixel. Because of the contour of the planarization layer 240 with via hole 245, the portion of the pixel defining layer 255 on the perimeter of the top of the via hole 245, is thinner than other portions thereof.

An emission layer 260 is disposed on the exposed portion of the pixel electrode 250. An opposite electrode 265 is disposed on the emission layer 260. In this case, the opposite electrode 265 is not formed in and around the via hole 245. Accordingly, even if a portion of the pixel defining layer 255 in the via hole 245 has a reduced thickness, the pixel electrode 250 and the opposite electrode 265 can not short circuit.

FIGS. 3A to 3C are cross-sectional views illustrating a method of fabricating an OLED according to an exemplary embodiment.

Referring to FIG. 3A, an optional buffer layer 205 is formed on a substrate 200 to prevent diffusion of impurities from the substrate 200 into the OLED during the fabrication of the OLED. In some embodiments, buffer layer 205 is not formed. The buffer layer 205 may comprise at least one of a silicon nitride ($SiN_X$) layer, a silicon oxide ($SiO_2$) layer, and a silicon oxynitride ($SiO_XN_Y$) layer.

A semiconductor layer 210 is formed on the buffer layer 205. The semiconductor layer 210 may comprise at least one of an amorphous silicon layer and a crystalline silicon layer. The crystalline silicon layer may be obtained by crystallizing the amorphous silicon layer.

A gate insulating layer 215 is formed on the semiconductor layer 210. The gate insulating layer 215 comprises an insulating material, such as a silicon oxide ($SiO_2$). A gate electrode 220 is formed on the gate insulating layer 215.

An interlayer insulating layer 225 is formed on the gate electrode 220. Contact holes are formed in the interlayer insulating layer 225 and in the gate insulating layer 215 to expose source and drain regions of the semiconductor layer 210. A conductive layer is deposited on the interlayer insulating layer 225 and patterned to form a source electrode 230a and a drain electrode 230b that are in contact with the exposed source and drain regions of the semiconductor layer 210, respectively.

An insulating layer 241 is formed over the source and drain electrodes 230a and 230b. The insulating layer 241 may comprise an inorganic layer, and/or an organic layer.

For example, an optional organic passivation layer 235 may be formed over the underlying structure to enhance the passivation and shielding of the semiconductor layer 210.

A planarization layer 240, which is an organic layer, is formed on the inorganic layer 235. The planarization layer 240 may comprise one or more of polyacrylates resin, epoxy resin, phenolic resin, polyamides resin, polyimides resin, unsaturated polyesters resin, poly(phenylenethers) resin, poly(phenylenesulfides) resin, and benzocyclobutene (BCB).

Referring to FIG. 3B, a via hole 245 is formed in the insulating layer 241 to expose the drain electrode 230b. A conductive layer is formed on the planarization layer 240 and patterned, thereby forming a pixel electrode 250.

Referring to FIG. 3C, a pixel defining layer 255 is formed to cover an upper region of the via hole 245, and an opening is formed in the pixel defining layer 255 to expose a portion of the pixel electrode 250. The pixel defining layer 255 serves to define the boundary of an emission region.

An emission layer 260 is formed on the exposed portion of the pixel electrode 250. Before or after the emission layer 260 is formed, a charge injection layer or charge transport layer (not shown) may additionally be formed. Also, the charge injection layer or charge transport layer may be formed across the entire underlying structure without requiring patterning.

The emission layer 260 may be formed using a laser induced thermal imaging (LITI) process. Accordingly, the pixel defining layer 255 may be formed with a thickness of about 3,000 Å or less in order to reduce the energy needed by the LITI process to effectively transfer the emission layer 260.

The pixel defining layer 255 may be formed with a thickness of about 1,500 Å or more so that as the substrate 200 becomes larger, the thickness uniformity of the pixel defining layer 255 formed across the entire surface of the substrate 200 may be maintained.

As discussed above, it is expected that because of the contour of the underlying structure, the thickness of the pixel defining layer 255 formed in and around the perimeter of the top of the via hole 245 may be thinner than the above-described thicknesses.

An opposite electrode 265 is formed on the emission layer 260. The opposite electrode 265 is patterned using a mask 65 such that at least an upper region of the via hole 245 is not covered by the opposite electrode 265. Accordingly, the opposite electrode 265 is not formed in and around the via hole 245. Thus, a short circuit between the pixel electrode 250 and the opposite electrode 265 is fundamentally prevented.

Figure 4:
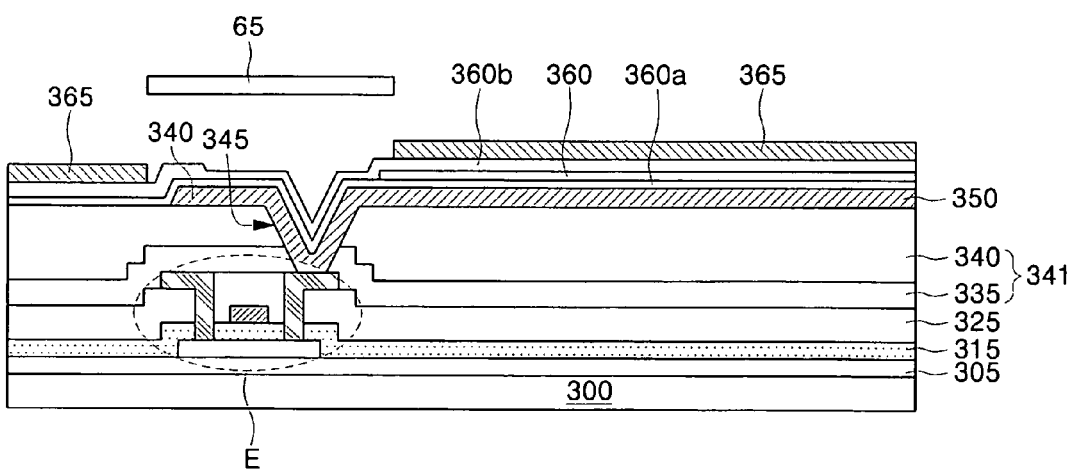
FIG. 4 is a cross-sectional view of an OLED according to a second exemplary embodiment.

FIG. 4 is a cross-sectional view of a unit pixel of an OLED according to a second exemplary embodiment of the present invention.

Referring to FIG. 4, another embodiment has an emission layer 360 and an opposite electrode 365 which are patterned without a pixel defining layer. As shown, the emission layer 360 is patterned over the underlying structure. Before or after the emission layer 360 is formed, a charge injection layer or charge transport layer (not shown) may additionally be formed. In some embodiments the charge injection layer or charge transport layer may be formed across the entire underlying structure without requiring patterning.

In some embodiments, before the emission layer 360 is formed, a hole injection layer or hole transport layer is formed as a first layer 360a. Thereafter, the emission layer 360 is formed on the hole injection layer or hole transport layer, and an electron transport layer or electron injection layer is formed as a second layer 360b on the emission layer 360. In other embodiments, the first common layer 360a may be an electron transport layer or electron injection layer depending on the pixel electrode 350, and the second common layer 360b may be a hole transport layer or hole injection layer.

In one embodiment, even if no insulating layer is formed adjacent to via hole 345 or an organic layer is formed across the underlying structure, the thickness of the organic layer may be thinner at the perimeter of the top of the via hole 345 than other portions.

An opposite electrode 365 is patterned on the substrate 300 such that it corresponds to an emission region. That is, the opposite electrode 365 is patterned using a mask 65 such that at least an upper region of the via hole 345 is not covered by the opposite electrode 365. Accordingly, the opposite electrode 265 is not formed in and around the via hole 245. Thus, a short circuit between the pixel electrode 250 and the opposite electrode 265 is fundamentally prevented without using the pixel defining layer.

Hereinafter, shapes of the opposite electrodes 265 and 365 according to some embodiments will be described with reference to FIGS. 5A to 5C.

Figure 5A:
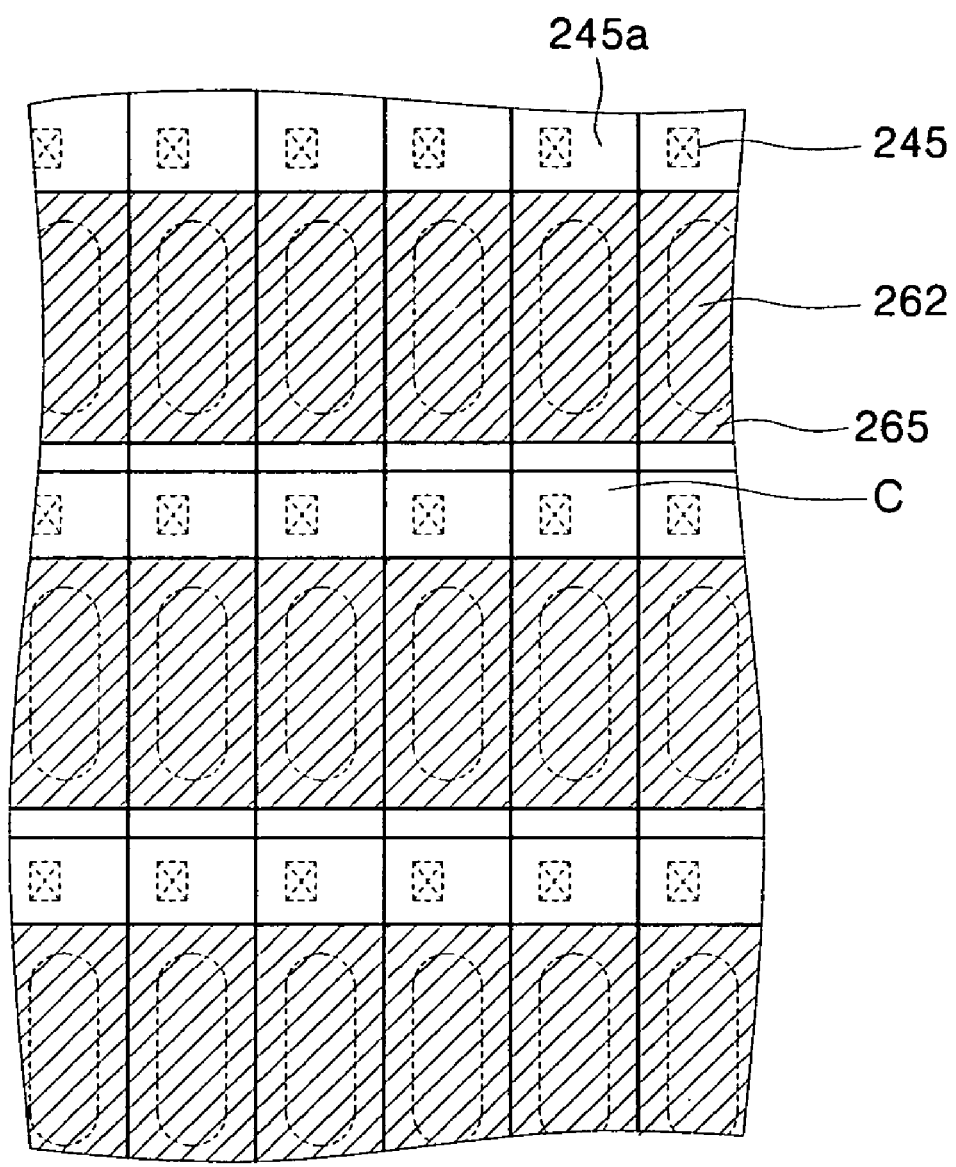
FIGS. 5A to 5C are plan views of an OLED including opposite electrodes according to other exemplary embodiments.
Figure 5B:
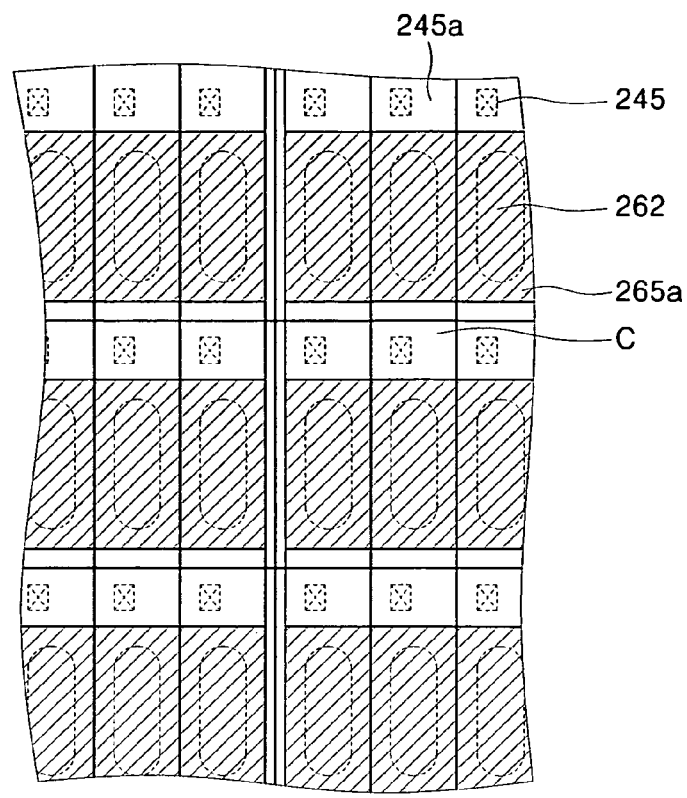
Figure 5B:
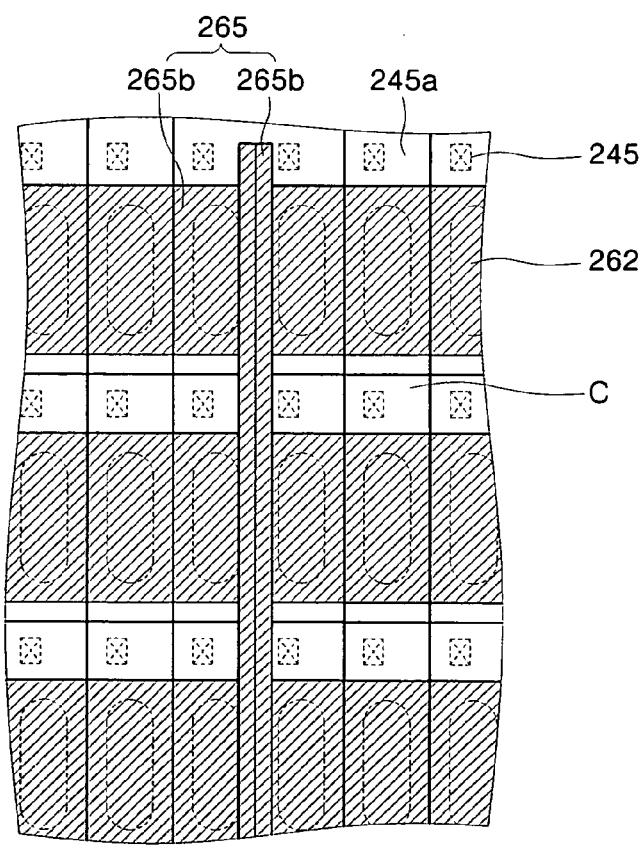
Figure 5C:
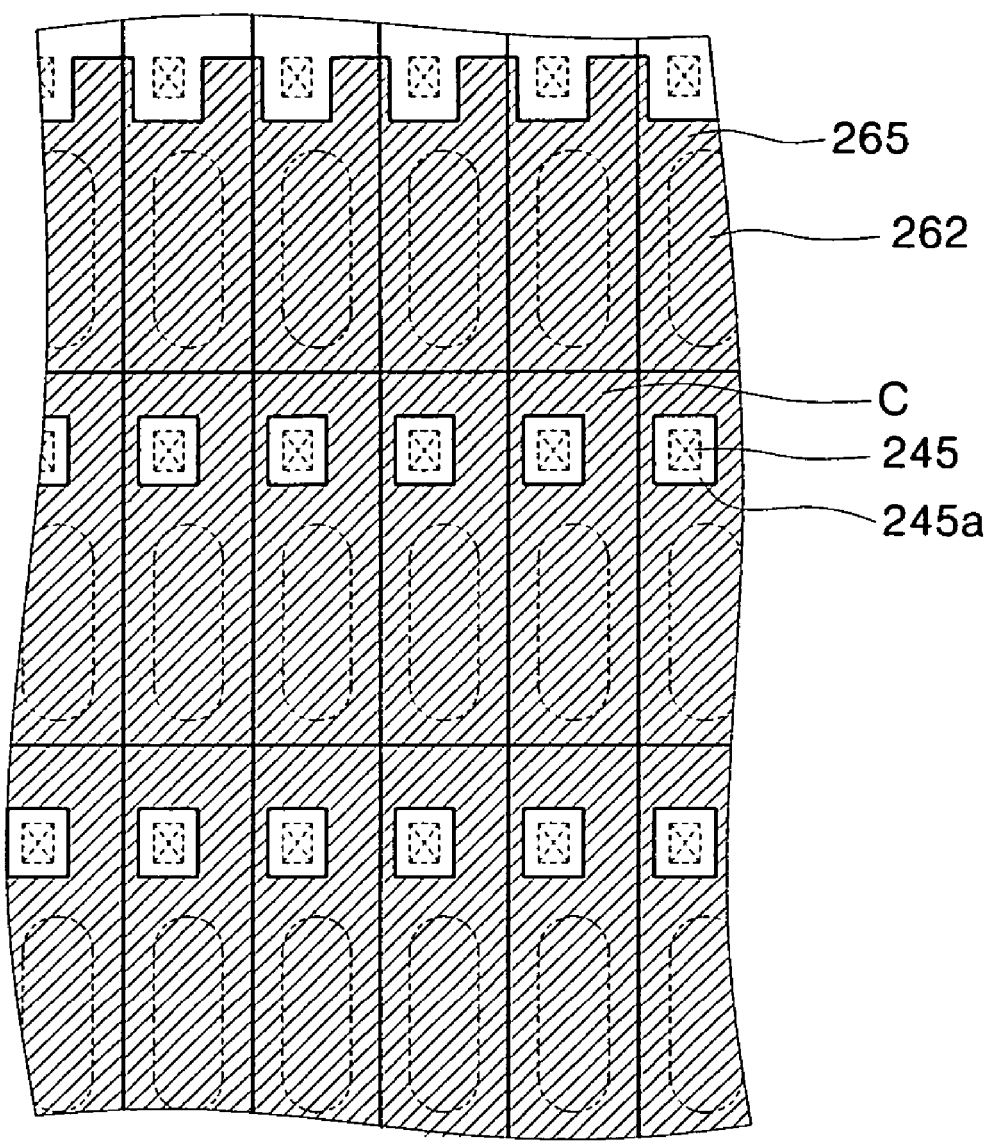

FIGS. 5A to 5C show various examples of the opposite electrodes 265 or 365, each of which is not formed in or around the via hole (245 or 345).

FIG. 5A shows a portion of an array of OLED pixels as described above with reference to FIGS. 3 and 4. The opposite electrode 265 may be patterned as alternating stripes over the emission regions 262. The gaps C in the opposite electrode 265 expose at least surrounding regions 245a of the via holes 245. Accordingly, the opposite electrode 265 is not formed in and around the via hole 245 so that short circuits between the pixel electrodes 250 and the opposite electrode 265 are fundamentally prevented, and the associated resulting dark spots in the OLED are avoided.

Referring to FIG. 5B, by using a first mask having a first slot corresponding to a portion where a first opposite electrode 265a will be formed, the first opposite electrode 265a is patterned in an emission region 262 over the underlying structure. Thereafter, in another portion of the array, a second opposite electrode 265b is additionally deposited using a second mask having a second slot. The second slot is perpendicular to the first slot of the first mask. Thus, the second opposite electrode 265b is connected to the first opposite electrode 265a so that an opposite electrode 265 is completed.

As a result, the opposite electrode 265 is not formed in and around the via hole 245 so that short circuits between the pixel electrodes 250 and the opposite electrode 265 are fundamentally prevented, and the associated resulting dark spots in the OLED are avoided. Also, since the first and second opposite electrodes 265a and 265b are perpendicularly connected, the current can be supplied more efficiently and the resistance of the opposite electrode 265 can be reduced.

FIG. 5C shows another patterning embodiment. By using a mask having a patterned portion corresponding to the via hole 245, the opposite electrode 265 can be patterned to expose only the surrounding regions 245a of the via holes 245. Accordingly, a short circuit between the pixel electrode 250 and the opposite electrode 265 can be fundamentally prevented like in FIGS. 4B and 4C.

Hence, the OLED can be freed from the generation of dark spots caused by short circuits in unit pixels.

According to some embodiments described above, the OLED includes an opposite electrode patterned so as to form the opposite electrode only in locations separate from the pixel via holes, where shorting between the opposite electrode and the pixel electrode may occur. Thus, even if a pixel defining layer or an organic layer is thin due to its underlying structure, a short circuit, and an associated OLED dark spot can be avoided.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of fabricating an organic light emitting display, comprising:
    forming a thin film transistor over a substrate, the thin film transistor including a gate electrode, a source electrode, and a drain electrode;
    forming an insulating layer over the thin film transistor;
    forming a via hole in the insulating layer in a location corresponding to a portion of one of the source and drain electrodes;
    electrically connecting a pixel electrode to one of the source and drain electrodes through the via hole;
    forming a pixel defining layer over the pixel electrode in at least a location corresponding to the via hole, wherein the pixel defining layer comprises an opening in a location corresponding to a portion of the pixel electrode and is formed with a thickness of about 3000 Å or less;
    forming an emission layer over the pixel electrode; and
    patterning an opposite electrode, the opposite electrode being disposed over the emission layer;
    wherein the emission layer and the opposite electrode are formed to each the via hole.

2. The method of claim 1, wherein patterning the opposite electrode comprises using a stripe-shaped mask.

3. The method of claim 1, wherein patterning the opposite electrode comprises using a slot-shaped mask.

4. The method of claim 1, wherein patterning the opposite electrode comprises using a mask comprising a patterned portion corresponding to at least the via hole.

5. The method of claim 1, wherein the pixel defining layer is formed with a thickness of about 1,500 Å or more.

6. The method of claim 1, wherein forming the insulating layer comprises using at least one of an inorganic layer, and an organic layer.

7. The method of claim 1, wherein forming the emission layer comprises using a laser induced thermal imaging process.

8. The method of claim 1, further comprising forming at least one of a charge injection layer and a charge transport layer over or under the emission layer.

9. An organic light emitting display manufactured by a process comprising:
    forming a thin film transistor over a substrate, the thin film transistor including a gate electrode, a source electrode, and a drain electrode;
    forming an insulating layer over the thin film transistor;
    forming a via hole in the insulating layer in a location corresponding to a portion of one of the source and drain electrodes;
    electrically connecting a pixel electrode to one of the source and drain electrodes through the via hole;
    forming a pixel defining layer over the pixel electrode in at least a location corresponding to the via hole, the pixel defining layer comprising an opening in a location corresponding to a portion of the pixel electrode and wherein the pixel defining layer is formed with a thickness of about 3,000 Å or less;
    forming an emission layer over the pixel electrode; and
    patterning an opposite electrode, the opposite electrode being disposed over the emission layer;
    wherein the emission layer and the opposite electrode are formed to each the via hole.

10. The display of claim 9, wherein the process further comprises forming the pixel defining layer with a thickness of about 1,500 Å or more.

* * * * *

UNITED STATES PATENT AND TRADEMARK OFFICE
CERTIFICATE OF CORRECTION

| | |
|---|---|
| PATENT NO. | : 8,004,176 B2 |
| APPLICATION NO. | : 11/247991 |
| DATED | : August 23, 2011 |
| INVENTOR(S) | : Tae-Wook Kang et al. |

It is certified that error appears in the above-identified patent and that said Letters Patent is hereby corrected as shown below:

At column 6, line 4, please delete "the via", and insert -- not extend over the via --, therefor.

At column 6, line 44, please delete "the via", and insert -- not extend over the via --, therefor.

Signed and Sealed this
Twentieth Day of March, 2012

David J. Kappos
*Director of the United States Patent and Trademark Office*